United States Patent
Imori et al.

(10) Patent No.: US 7,179,741 B2
(45) Date of Patent: Feb. 20, 2007

(54) ELECTROLESS PLATING METHOD AND SEMICONDUCTOR WAFER ON WHICH METAL PLATING LAYER IS FORMED

(75) Inventors: Toru Imori, Kitaibaraki (JP); Junnosuke Sekiguchi, Kitaibaraki (JP); Atsushi Yabe, Kitaibaraki (JP)

(73) Assignee: Nikko Materials Co., Ltd., Tokyo (JP)

( * ) Notice: Subject to any disclaimer, the term of this patent is extended or adjusted under 35 U.S.C. 154(b) by 145 days.

(21) Appl. No.: 10/472,678

(22) PCT Filed: Mar. 26, 2003

(86) PCT No.: PCT/JP03/03707

§ 371 (c)(1),
(2), (4) Date: Sep. 18, 2003

(87) PCT Pub. No.: WO03/091476

PCT Pub. Date: Nov. 6, 2003

(65) Prior Publication Data

US 2004/0235294 A1 Nov. 25, 2004

(30) Foreign Application Priority Data

Apr. 23, 2002 (JP) .......................... 2002-120289

(51) Int. Cl.
*H01L 21/44* (2006.01)
(52) U.S. Cl. .............. 438/675; 257/E21.175; 438/678
(58) Field of Classification Search ............... 438/678, 438/675; 257/E21.175
See application file for complete search history.

(56) References Cited

U.S. PATENT DOCUMENTS

| | | | |
|---|---|---|---|
| 5,160,452 A | 11/1992 | Marutsuka et al. | |
| 5,685,898 A * | 11/1997 | Dupuis et al. ............. | 106/1.11 |
| 6,284,309 B1 * | 9/2001 | Bishop et al. ............. | 427/98.8 |
| 6,767,828 B2 * | 7/2004 | Andry et al. .............. | 438/677 |
| 2001/0012869 A1 | 8/2001 | Fukushima et al. | |
| 2002/0036143 A1 | 3/2002 | Segawa et al. | |
| 2002/0132056 A1 * | 9/2002 | Montano et al. ............ | 427/402 |

FOREIGN PATENT DOCUMENTS

| | | |
|---|---|---|
| EP | 0 347 114 | 12/1989 |
| EP | 0 506 993 A1 | 10/1992 |
| EP | 1 375 699 A1 | 1/2004 |
| JP | 51-90938 | 8/1976 |
| JP | 1-315334 | 12/1989 |
| JP | 10-326957 | 12/1998 |
| JP | 10-326957 A | 12/1998 |
| JP | 11-510219 | 9/1999 |
| JP | 2000-129211 A | 5/2000 |
| JP | 2000-349417 A | 12/2000 |
| JP | 2001-181853 | 7/2001 |
| JP | 2001-230527 | 8/2001 |
| JP | 2001-323381 | 11/2001 |
| JP | 2001-355074 | 12/2001 |
| KR | 2002-0075884 A | 10/2002 |
| WO | WO 02/077321 A1 | 10/2002 |

OTHER PUBLICATIONS

IBM Tech. Discl. Bull. NN68031580, Mar. 1968, vol. 10, Num. 10, p. 1580.*

* cited by examiner

*Primary Examiner*—Caridad Everhart
(74) *Attorney, Agent, or Firm*—Flynn, Thiel, Boutell & Tanis, P.C.

(57) ABSTRACT

It is an object of the present invention to provide a semiconductor wafer on which a thin, smooth, uniform and good adhesive electroless plating layer that can be suitable for a seed layer is formed, and to provide an electroless plating method which is suitable for use in the manufacture of such a semiconductor wafer.

A semiconductor wafer is coated with a silane coupling agent which has a functional group that is able to capture a metal, and is further coated with an organic-solvent solution of a palladium compound such as palladium chloride or the like. Afterward, the wafer is electroless plated. As a result of such an electroless plating method, a semiconductor wafer having a thickness of 70 to 5000 angstroms and a mean surface roughness Ra of 10 to 100 angstroms can be obtained.

16 Claims, No Drawings

ELECTROLESS PLATING METHOD AND SEMICONDUCTOR WAFER ON WHICH METAL PLATING LAYER IS FORMED

TECHNICAL FIELD

The present invention relates to an electroless plating which allows an electroless plating layer used to form copper wiring on the surface being plated to be smooth, uniform and high-adhesion format, especially an electroless plating which is ideal for embedding fine vias or trenches formed on a semiconductor wafer without generating defects such as voids, seams or the like, and to a semiconductor wafer which is thus plated with the electroless plating.

BACKGROUND ART

Conventionally, aluminum has been the main wiring material in the processing of semiconductor wafers. Recently, in order to increase the degree of integration of wiring, an increase in the signal delay time has been prevented by switching aluminum to copper, which has a high electrical conductivity. The damascene method is used for the formation of copper wiring. Generally in the process, a wiring pattern is formed on a silicon wafer, after which a barrier layer or seed layer is formed by a sputtering or CVD method, a wiring pattern is embedded by electroplating, and the excess deposited copper is removed by CMP. As wiring patterns have become increasingly finer, the coverage of copper seed layers on the inside walls of vias and trenches formed by sputtering methods has become inadequate, thus causing the defects at the electroplating. A method for solving this problem has been researched.

Electroless plating is one method of forming a metal coating film on an underlying material that does not possess conductivity; this technique is utilized in the formation of printed wiring on resin substrates and the like. A method known as activation, in which a noble metal such as palladium or the like is adhered to the underlying material beforehand as a catalyst, is common pre-treatment for a semiconductor device in such electroless plating. In the past, methods have been used in which Pd is adhered by an immersion treatment in an aqueous solution of $PdCl_2$ following treatment with a hydrochloric acid aqueous solution of $SnCl_2$, or in which Pd is supported on the surface by means of a colloidal solution containing Sn and Pd.

DISCLOSURE OF THE INVENTION

However, in the case of conventional methods, it is difficult to form a thin seed layer with good adhesion as an electroless plating layer that is also smooth, uniform and free of defects, on the surface of a semiconducting mirror-surface substance such as a semiconductor wafer, or on the inside walls of vias or trenches formed in such a surface.

In light of the above facts, it is an object of the present invention to provide a novel metal plating technique using electroless plating that allows an electroless plating to be smooth and uniform as well as good adhesive as a thin seed layer even on semiconductor wafers such as Si wafers or the like, which cannot be easily electroless plated by conventional way, and, the novel metal plating technique also solves the insufficient coverage of the seed layer on the inside walls of vias and trenches that causes a problem in the case of the above-mentioned fine wiring.

As a result of diligent research, the present invention unexpectedly discovered that the above-mentioned problems are solved by using a palladium compound, which is an electroless plating catalyst, in the form of an organic-solvent solution instead of the conventional aqueous medium. This discovery led to the perfection of the present invention.

The present invention relates to:

(1) An electroless plating method comprising:
coating a surface to be plated with a solution of a silane coupling agent which has a functional group that is able to capture a metal,
further coating the surface with an organic-solvent solution of a palladium compound, and
electroless plating the surface;

(2) An electroless plating method comprising:
coating a surface to be plated with a solution of a silane coupling agent which has a functional group that is able to capture a metal,
further coating the surface with an organic-solvent solution of a palladium compound,
electroless plating the surface with nickel, cobalt or an alloy of these metals, and
electroless plating the surface with copper;

(3) An electroless plating method for a semiconductor wafer according to the above (1) or (2), wherein a method of the coating is spin coating, immersion or spray coating;

(4) A semiconductor wafer on which an electroless plating layer with a thickness of 70 to 5000 angstroms and a mean surface roughness Ra of 10 to 100 angstroms is formed;

(5) A semiconductor wafer on which a metal plating layer is formed by a method according to any of the above (1) through (3); and (6) A semiconductor device which is manufactured from a semiconductor wafer according to the above (4) or (5).

BEST MODE FOR CARRYING OUT THE INVENTION

Generally, it has been difficult to fix noble metal ions serving as a catalyst to the surfaces of semiconducting mirror-surface substances such as semiconductor wafers. In the present invention, however, such ions can be effectively fixed to the surface of a semiconductor wafer by using a treatment agent that has both the function of capturing the catalyst and the function of adhering to the semiconductor wafer in the same molecule, and using a catalytic palladium compound in the form of an organic-solvent solution. In particular, it is important in the present invention that the palladium compound that functions as an electroless plating catalyst be used in the form of an organic-solvent solution.

As a result, the present invention makes it possible to form a thin, defect-free, smooth and uniform electroless plating layer. In cases where the palladium compound is used in the form of an aqueous solution, as will be described later, the desired object of the present invention cannot be achieved even if the specified silane coupling agent used in the present invention is used.

The functional group that is able to capture a metal that is useful in the present invention includes amino groups, carboxyl groups, azole groups, hydroxyl groups and mercapto groups, although the present invention is not limited to such groups. Among these groups, azole groups are especially desirable. Examples of azole groups include imidazole groups, oxazole groups, thiazole groups, selenazole groups, pyrazole groups, isooxazole groups, isothiazole groups, triazole groups, oxadiazole groups, thiadiazole groups, tetrazole groups, oxatriazole groups, thiatriazole groups, bendazole groups, indazole groups, benzimidazole groups and benzotriazole groups. Among these groups, imidazole groups are especially desirable.

Furthermore, the above-mentioned silane coupling agent is a compound which has a —$SiX_1X_2X_3$ group in addition to the above-mentioned noble metal ion capturing group. $X_1$, $X_2$ and $X_3$ each indicate an alkyl group, a halogen atom, an alkoxy group, and may be any functional groups that are capable of fixing to the substance being plated. $X_1$, $X_2$ and $X_3$ may be the same or different. Examples of especially desirable compounds are silane coupling agents obtained by the reaction of an azole type compound and an epoxysilane type compound. In particular, compounds obtained by reacting with an imidazole compound as the azole compound may be cited as examples of especially desirable silane coupling agents.

Furthermore, epoxysilane coupling agents expressed by the formula:

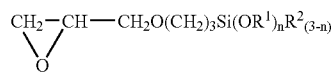

(In the formula, $R^1$ and $R^2$ each are a hydrogen atom or an alkyl group with 1 to 3 carbon atoms, and n is 0 to 3) are desirable as epoxysilane type compounds in order to be reacted with such nitrogen-containing heterocyclic azole compounds.

The reaction between said azole compound and said epoxy-group-containing silane compound can be performed under the conditions described in Japanese Patent Publication No. 6-256358. For example, 0.1 to 10 moles of the epoxy-group-containing compound is added dropwise and reacted for 5 minutes to 2 hours with 1 mole of the azole compound at 80 to 200° C. In this case, there is no particular need for a solvent; however, an organic solvent such as chloroform, dioxanemethanol, ethanol or the like may also be used.

The reaction of the imidazole type compound and epoxysilane type compound indicated above as especially desirable examples is as follows:

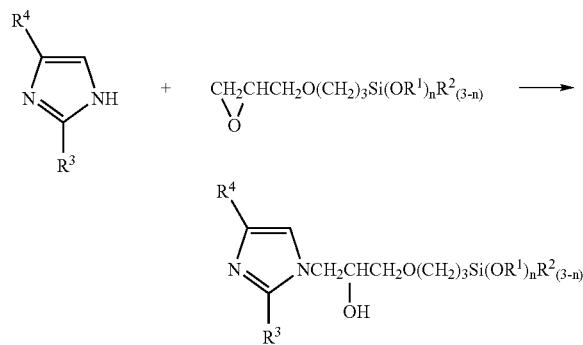

(In the above formula, $R^1$ and $R^2$ each are a hydrogen atom or an alkyl group with 1 to 3 carbon atoms, $R^3$ is a hydrogen atom or an alkyl group with 1 to 20 carbon atoms, $R^4$ is a vinyl group or an alkyl group with 1 to 5 carbon atoms, and n is 0 to 3).

Other examples of the silane coupling agents with an ability to capture a metal that can be used in the present invention include
γ-aminopropyltrimethoxysilane,
γ-aminopropyltriethoxysilane,
N-β(aminoethyl)-γ-aminopropyltrimethoxysilane,
N-β(aminoethyl)-γ-aminopropyltriethoxysilane,
γ-mercaptopropyltrimethoxysilane and the like.

Examples of the aforementioned palladium compounds include chlorides, hydroxides, oxides, sulfates, amine complexes such as ammonium salts or the like of palladium which show a catalytic effect when copper, nickel, cobalt or the like is deposited on the surface of the substance to be plated from an electroless plating solution. Palladium chloride is especially desirable. It is necessary that the palladium compound be used in the form of an organic-solvent solution. Examples of organic solvents that can be used include methyl alcohol, ethyl alcohol, isopropanol, acetone, methyl ethyl ketone, toluene, ethylene glycol, polyethylene glycol, dimethylformamide, dimethyl sulfoxide and dioxane, as well as mixtures of these solvents. Furthermore, it is desirable that the concentration in the solution be 20 to 300 mg/L.

The semiconductor wafers referred to in the present invention naturally include silicon wafers, and also include compound semiconductor wafers such as gallium-arsenic, gallium-phosphorus and indium-phosphorus wafers. In the metal plating method of the present invention, there are no restrictions on the material of the surface of the semiconductor wafer that is plated. For example, in cases where LSI wiring is formed, a film of barrier metal with a low conductivity selected from a group consisting of titanium, tantalum, tungsten and nitrides of these metals formed by vacuum evaporation, sputtering or CVD constitutes the surface to be plated. In all of these cases, the method of the present invention can be used effectively. Furthermore, even in cases where the surface to be plated consists of silicon or a silicon oxide film, the method of the present invention can be used efficiently.

In cases where the underlying material to be electroless plated is subjected to the surface treatment with the silane coupling agent which has the functional group capable of capturing metals as described above, this liquid may be used by use of a solution of the agent dissolved in an appropriate solvent, e. g. water, methyl alcohol, ethyl alcohol, isopropanol, acetone, methyl ethyl ketone, toluene, ethylene glycol, polyethylene glycol, dimethylformamide, dimethyl sulfoxide or dioxane, as well as mixtures of these solvents. In cases where water is used, it is particularly necessary to optimize the pH in accordance with the surface that is being plated and the plating conditions. However, as the palladium compound, the solution of the silane coupling agent is also more preferably used in the form of an organic-solvent solution.

For semiconductor wafers, generally the solvent is volatilized following the coating of the surface by an immersion treatment. In the present invention, however, application by means of spin coating is desirable. In regard to the concentration of the silane coupling agent with the functional group capable of capturing metals in the solution, a concentration of 0.001 to 10 wt % is easy to use, although the present invention is not limited to such a concentration. In cases where the concentration is less than 0.001 wt %, the amount of the compound that adheres to the surface of the substrate tends to drop, so that it is difficult to obtain an effect. On the other hand, if the concentration exceeds 10 wt %, the amount of adhering compound is excessive, so that drying becomes difficult and the aggregation of powder tends to occur. When the surface is dried following the surface treatment, it is sufficient to heat to a temperature exceeding the volatilization temperature of the solvent so that the solvent is volatilized; however, it is desirable to heat the surface for an additional 3 to 10 minutes at 60 to 150° C. In cases where water is used as the solvent, the drying process can be omitted, and plating can be performed with only a water rinse following the surface treatment. In this case, however, a thorough water rinse must be conducted so that the catalyst is not carried into the plating solution. In regard to the temperature at the pre-treatment, room temperature is sufficient; however, the rate and the amount of adhesion of the catalyst can be increased by heating. At the heating, a temperature of 30 to 80° C. is advisable. Naturally, the surface to be plated may also be cleaned prior to the pre-treatment. In some cases, treatment with a solution containing a reducing agent prior to plating is effective. Especially in copper plating, treatment with a dimethylamine-borane solution or the like as a reducing agent is preferable.

The present invention makes it possible to plate the surface of a semiconductor wafer with a metal such as copper, nickel, cobalt, tin or gold by electroless plating. When LSI wiring is formed, vias or trenches used to embed the copper wiring are formed in the surface of the semiconductor wafer (consisting of silicon or the like), and the surfaces of these vias or trenches are covered to a thickness of approximately 0.01 to 0.1 μm with a barrier metal selected from a group consisting of titanium, tantalum, tungsten or nitrides of these metals by sputtering or CVD in order to prevent the copper from diffusing into the silicon.

Conventionally, furthermore, the surface of this barrier metal layer has been covered with a thin copper layer (seed layer) by sputtering or CVD in the same manner as described above. The above-mentioned barrier metal generally has a large electrical resistance, so that the difference of the current density between the central portions and the contact areas located in the peripheral of the wafer becomes large in the copper electroplating that is subsequently applied; accordingly, copper with a small electrical resistance is applied (as a thin covering) in advance. However, as wiring is finer so that the diameters of vias and trenches are smaller, it becomes impossible to obtain sufficient coverage of the inside walls of such vias and trenches by using common conventional sputtering methods. This has led to the generation of defects (voids and seams) when the walls are subsequently electroplated. In the case of CVD methods, on the other hand, the coverage is improved, but the cost is extremely high.

In the present invention, instead of using a conventional seed layer formation method, a seed layer is formed by electroless plating with copper or nickel after a catalyst has been applied to the surface of the barrier metal by the above-mentioned pre-treatment method. This method makes it possible to solve the problem of inadequate coverage of the inside walls of vias and trenches of fine wiring at a lower cost than in the case of a CVD method. When copper is applied by electroless plating, not only the formation of a seed layer, but also the embedding of wiring, can be accomplished by electroless plating by continuing the process. In electroless plating, a film is grown uniformly with respect to the surface being plated if a catalyst is uniformly applied to the surface being plated; accordingly, seams tend to be generated in the case of fine wiring. However, in cases where the catalyst is applied by the above-mentioned pre-treatment method, the catalyst adheres readily to the inside walls of the fine wiring. Since a metal tends to be deposited in areas where the amount of adhering catalyst is large, then a bottom-up type deposition like as the copper electroplating solution used for the embedding of fine wiring occurs, depending on the aspect ratio of the vias or trenches. As a result, fine wiring can be embedded without the generation of seams. Of course, it is also possible to embed the wiring by copper electroplating following the formation of a seed layer by electroless copper plating. Generally, formalin is contained as a reducing agent in such an electroless copper plating solution. In recent years, however, because of an increase of problems that damage the environment, there has been a tendency to avoid the use of formalin. Accordingly, this problem can be solved by using an electroless nickel plating solution. In the electroless nickel plating, phosphorus or boron is generally contained in the coating film at the rate of several percent; as a result, the electrical resistance is increased. Accordingly, if a seed layer is formed by electroless nickel plating, it is necessary to suppress the film thickness to the minimum thickness at which electrical continuity is achieved. An alkali component is contained as a raw material in many electroless copper plating solutions and electroless nickel plating solutions. In wiring materials, such an alkali component is a most undesirable impurity; accordingly, a raw material that does not contain this impurity must be used. For example, it is advisable to use tetramethylammonium hydroxide instead of the sodium hydroxide that is used to adjust the pH. Furthermore, it is advisable to use dimethylamine-borane as the reducing agent in the electroless nickel plating solution.

Furthermore, in the case where LSI wiring is formed, the formation of a barrier metal on the insulating film can also be accomplished by the electroless plating method of the present invention. Conceivable examples of the barrier metal in this case include nickel, cobalt and alloys of these metals with other metals (such as tungsten or the like). Naturally, the formation of copper wiring can also be accomplished by the electroless plating method of the present invention.

By using such electroless plating of the present invention, it is possible to form a plating layer with a thickness of 70 to 5000 angstroms and a mean surface roughness Ra of 10 to 100 angstroms, preferably a thickness of 100 to 3000 angstroms and a mean surface roughness Ra of 20 to 70 angstroms.

EXAMPLE 1

A 0.02% isopropyl alcohol solution of a silane coupling agent that was an equimolar reaction product of imidazole and γ-glycidoxypropyltrimethoxysilane was applied for 1 minute at 1000 rpm by means of a spin coater to a silicon wafer whose surface had been converted into $SiO_2$ by thermal diffusion. Following drying for 5 minutes at 100° C. by means of a drier, the coated wafer was cooled to room temperature, and an isopropyl alcohol solution of palladium chloride (Pd concentration: 60 mg/L) was applied for 1 minute at 1000 rpm by means of a spin coater. Following drying for 5 minutes at 100° C. by means of a drier, the sample was cooled to room temperature, and was immersed in an electroless nickel plating solution, so that electroless nickel plating was performed. As a result of a tape peeling test performed on a mirror surface, the nickel plating film thus obtained showed good adhesion. As a result of measurement of the film thickness by Auger analysis, it was estimated that the thickness of the nickel film was 400 angstroms (Both figures were converted with $SiO_2$). Furthermore, as a result of measurement of the surface roughness by AFM, it was found that the mean roughness Ra was 62 angstroms.

EXAMPLE 2

A 0.02% isopropyl alcohol solution of a silane coupling agent that was an equimolar reaction product of imidazole and γ-glycidoxypropyltrimethoxysilane was applied for 1 minute at 1000 rpm by means of a spin coater to a silicon wafer whose surface had been converted into $SiO_2$ by thermal diffusion. Following drying for 5 minutes at 100° C. by means of a drier, the coated wafer was cooled to room temperature, and an isopropyl alcohol solution of palladium chloride (Pd concentration: 60 mg/L) was applied for 1 minute at 1000 rpm by means of a spin coater. Following drying for 5 minutes at 100° C. by means of a drier, the sample was cooled to room temperature, and was immersed in an electroless nickel plating solution, so that electroless nickel plating was performed; then, the sample was electroless plated with copper. As a result of a tape peeling test carried out on a mirror surface, the copper plating film thus obtained showed good adhesion. As a result of measuring the film thickness by Auger analysis, it was estimated that the thickness of the nickel film was 700 angstroms, and that the thickness of the copper film was 2000 angstroms (Both figures were converted with $SiO_2$). Furthermore, as a result of measurement of the surface roughness by AFM, it was found that the mean roughness Ra was 53 angstroms.

EXAMPLE 3

A 0.022% methyl ethyl ketone solution of a silane coupling agent that was an equimolar reaction product of imidazole and γ-glycidoxypropyltrimethoxysilane was applied for 1 minute at 1000 rpm by means of a spin coater to a silicon wafer whose surface had been converted into $SiO_2$ by CVD. Following drying for 5 minutes at 100° C. by means of a drier, the coated wafer was cooled to room temperature, and a methyl ethyl ketone solution of palladium chloride (Pd concentration: 60 mg/L) was applied for 1 minute at 1000 rpm by means of a spin coater. Following drying for 5 minutes at 100° C. by means of a drier, the sample was cooled to room temperature, and was immersed in an electroless nickel plating solution, so that electroless nickel plating was performed; then, the sample was electroless plated with copper. As a result of a tape peeling test performed on a mirror surface, the copper plating film thus obtained showed good adhesion. As a result of measurement of the film thickness by Auger analysis, it was estimated that the thickness of the nickel film was 1200 angstroms, and that the thickness of the copper film was 600 angstroms (Both figures were converted with $SiO_2$). Furthermore, as a result of measurement of the surface roughness, it was found that the mean roughness Ra was 51 angstroms.

EXAMPLE 4

A 0.02% methanol solution of a silane coupling agent that was an equimolar reaction product of imidazole and γ-glycidoxypropyltrimethoxysilane was applied for 1 minute at 1000 rpm by means of a spin coater to a silicon wafer whose surface had been converted into $SiO_2$ by thermal diffusion. Following drying for 5 minutes at 100° C. by means of a drier, the coated wafer was cooled to room temperature, and a methanol solution of palladium chloride (Pd concentration: 100 mg/L) was applied for 1 minute at 1000 rpm by means of a spin coater. Following drying for 5 minutes at 100° C. by means of a drier, the sample was cooled to room temperature, and was immersed in an electroless copper plating solution so that electroless copper plating was performed. As a result of a tape peeling test performed on a mirror surface, the copper plating film thus obtained showed good adhesion. As a result of measurement of the film thickness by Auger analysis, it was found that the thickness of the copper film was 400 angstroms (Both figures were converted with $SiO_2$). Furthermore, as a result of measurement of the surface roughness by AFM, it was found that the mean roughness Ra was 43 angstroms.

COMPARATIVE EXAMPLE 1

A 0.02% isopropyl alcohol solution of a silane coupling agent that was an equimolar reaction product of imidazole and γ-glycidoxypropyltrimethoxysilane was applied for 1 minute at 1000 rpm by means of a spin coater to a silicon wafer whose surface had been converted into $SiO_2$ by thermal diffusion. Following drying for 5 minutes at 100° C. by means of a drier, the coated wafer was cooled to room temperature, and a aqueous solution of palladium chloride (Pd concentration: 60 mg/L) was applied for 1 minute at 1000 rpm by means of a spin coater. Following drying for 5 minutes at 100° C. by means of a drier, the sample was cooled to room temperature, and was immersed in an electroless nickel plating solution, so that electroless nickel plating was performed. The areas that were not plated remained on the wafer.

COMPARATIVE EXAMPLE 2

Isopropyl alcohol was applied for 1 minute at 1000 rpm by means of a spin coater to a silicon wafer whose surface had been converted into $SiO_2$. Following drying for 5 minutes at 100° C. by means of a drier, the coated wafer was cooled to room temperature, and an aqueous solution of palladium chloride (Pd concentration: 60 mg/L) was applied for 1 minute at 1000 rpm by means of a spin coater. Following drying for 5 minutes at 100° C. by means of a drier, the sample was cooled to room temperature, and was immersed in an electroless nickel plating solution, so that electroless nickel plating was performed. The surface of the wafer was not plated at all.

COMPARATIVE EXAMPLE 3

An isopropyl alcohol solution of palladium chloride (Pd concentration: 60 mg/L) was applied for 1 minute at 1000 rpm by means of a spin coater to a silicon wafer whose surface had been converted into $SiO_2$. Following drying for 5 minutes at 100° C. by means of a drier, the coated wafer was cooled to room temperature, and was immersed in an electroless nickel plating solution, so that electroless nickel plating was performed. The surface of the wafer was not plated at all.

INDUSTRIAL APPLICABILITY

In the method of the present invention, as described above, by a palladium compound which is a catalyst is used in the from of an organic-solvent solution, the compound can therefore be uniformly fixed to even semiconducting mirror-surfaces such as semiconductor wafers an to the inside wall of vias and trenches formed on such a surface. Thereby, electroless plating can easily be performed although such coverage has been difficult in the past. As a result of such electroless plating, a suitable metal thin film can be formed smoothly, uniformly and with good adhesion as a seed layer on the surface of a semiconductor wafer.

The invention claimed is:

1. An electroless metal plating method comprising:
coating a mirror-surface to be plated with a solution of a silane coupling agent which has an azole group,
further coating the surface with an organic solvent solution of a palladium compound, and
electroless metal plating the surface.

2. An electroless plating method according to claim 1, wherein a method of the coating is a spin coating.

3. A semiconductor wafer on which a metal plating layer is formed by a method according to claim 1.

4. An electroless plating method according to claim 1, wherein the organic solvent is isopropyl alcohol.

5. An electroless plating method according to claim 1, wherein the organic solvent is methyl ethyl ketone.

6. An electroless plating method according to claim 1, wherein the organic solvent is methanol.

7. An electroless plating method according to claim 1, wherein the silane coupling agent is a reaction product of imidazole and γ-glycidoxypropyl-trimethoxysilane.

8. An electroless plating method according to claim 1, wherein said surface to be plated is the surface of a silicon wafer.

9. An electroless plating method comprising:
coating a surface to be plated with a solution of a silane coupling agent which has an azole group,
further coating the surface with an organic solvent solution of a palladium compound,
electroless plating the surface with nickel, cobalt or an alloy of these metals, and
electroless plating the surface with copper.

10. An electroless plating method according to claim 9, wherein the organic solvent is isopropyl alcohol.

11. An electroless plating method according to claim 9, wherein the organic solvent is methyl ethyl ketone.

12. An electroless plating method according to claim 9, wherein the organic solvent is methanol.

13. An electroless plating method according to claim 9, wherein the silane coupling agent is a reaction product of imidazole and γ-glycidoxypropyl-trimethoxysilane.

14. An electroless plating method according to claim 9, wherein said surface to be plated is the surface of a silicon wafer.

15. A semiconductor wafer on which an electroless plating layer with a thickness of 70 to 5000 angstroms and a mean surface roughness Ra of 10 to 100 angstroms is formed.

16. A semiconductor device which is manufactured from a semiconductor wafer according to claim 15.

* * * * *